United States Patent

[11] 3,581,124

[72] Inventors Richard A. Flores
425 S. Reese Place, Burbank, Calif. 91506;
Michael Sherman, 17042 Lorillard St.,
Granada Hills, Calif. 91344

[21] Appl. No. 797,719
[22] Filed Jan. 17, 1969
[45] Patented May 25, 1971

[54] SOLID-STATE TOUCH-RESPONSIVE SWITCH CIRCUIT
8 Claims, 3 Drawing Figs.

[52] U.S. Cl. .......... 307/308, 307/289, 328/5, 307/270, 307/288
[51] Int. Cl. .......... H03k 4/48
[50] Field of Search .......... 307/308, 253, 21 (B), 269; 328/5

[56] References Cited
UNITED STATES PATENTS

| | | | |
|---|---|---|---|
| 2,659,533 | 11/1953 | Quinby | 307/308 |
| 3,075,085 | 1/1963 | Helbig et al. | 307/269 |
| 3,237,024 | 2/1966 | Mavity | 307/238 |
| 3,247,399 | 4/1966 | Moody | 307/269 |

*Primary Examiner*—Donald D. Forrer
*Assistant Examiner*—Harold A. Dixson
*Attorney*—George W. Seevers

ABSTRACT: A solid-state touch-responsive switch circuit using principally NPN transistors. The base of the first transistor is connected direct to a grounding key adapted preferably to be touched by a finger. The emitter of the transistor is connected to ground through a clock-pulse generator. The collector of this transistor is connected to a power supply through a suitable resistor and to the base of a second transistor through a rectifying diode. This second transistor together with transistors three and four comprise a clamping and amplifying circuit for the output. A feedback line from the outputs of the amplifying transistors back to the base of the first transistor through a diode clamps the output "on" only after the finger has switched the base of the first transistor to "on" and holds it on when the finger has been removed from the key.

*INVENTORS:*
RICHARD A. FLORES
MICHAEL SHERMAN
BY
ATTORNEY

PATENTED MAY 25 1971

3,581,124

*INVENTORS:*
RICHARD A. FLORES
MICHAEL SHERMAN
BY [signature]
ATTORNEY

SOLID-STATE TOUCH-RESPONSIVE SWITCH CIRCUIT

DISCUSSION OF THE PRIOR ART AND OBJECTS

Heretofore, touch-responsive switches and their circuits were, in their early development at least, pretty much a circuit or system using a gas-discharge or triode device triggered by capacitive discharge in which the grid was excited or grounded to cause the triode to switch a circuit on or off. Later other circuits made use of solid-state transistors, but, here again, they depended upon the capacity discharge principle for their operation. As a result of this the prior art switches and circuits, therefore, were noisy, costly, unreliable and bulky.

One object of this invention is to overcome the objections to the prior art devices by providing a solid-state switch circuit that has no moving parts, is fast, positive and quiet, uses a very low voltage to operate which is on continuously, but is switched to a different state to signal "on" and which can be manufactured economically and as an integrated circuit.

A further object of this invention is to provide a solid-state switch which can be used either as a keyboard for such mechanisms as an adding machine calculator, organ, or the like, and can equally as well be used as a keyboard to feed direct logic information to computer inputs.

A further object of this invention is to provide a switch circuit that is insensitive to spurious noises and finger jitter and which is provided with computer clock pulses other desired pulse train to actively operate the circuit in a pulse-amplifier mode.

A still further object of this invention is to provide a solid-state switch circuit, the output levels of which are directly compatible with computer-integrated circuit logic.

Other objects and advantages of this invention will become apparent as the disclosure proceeds and when taken in connection with the accompanying drawings, in which.

Figure 1:
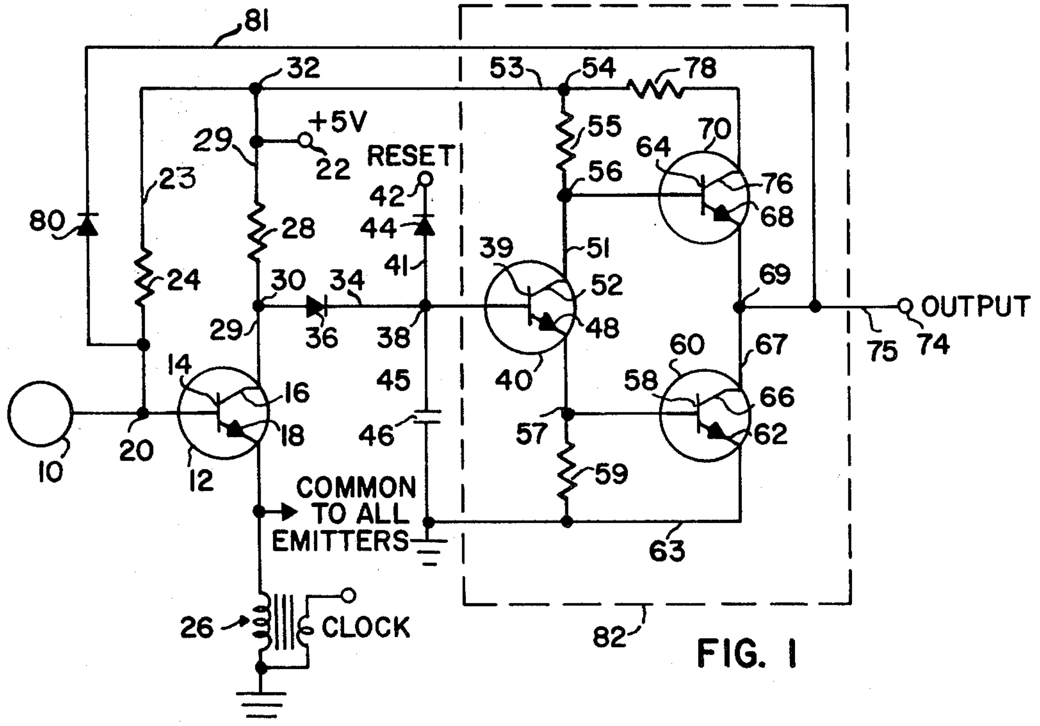
FIG. 1 is a diagram of a preferred embodiment of this invention showing the use of a feedback to the base of transistor one causes a "hold" once the switch is triggered.

Turning now 2N3646 be detailed description of the drawings, wherein like numerals refer to like parts and circuits, the numeral 10 designates a symbolic touch contact key. The numeral 12 designates generally a first NPN transistor such as a 2N3646 having a conventional base 14, collector 16 and emitter 18. Contact key 10 is connected to base 14 and at point 20 both key 10 and base 14, used here as a floating base, are connected to a plus 5-volt DC power supply 22 by means of line 23. A resistor 24 of 51 k. ohms is connected between point 20 and power supply 22. A suitable clock or pulse timer 26, such as the clock pulse of a computer, or the like, is connected to emitter 18. Power supply 22 is connected to collector 16 by means of line 29. A resistor 28 of 5.1 k. ohms is connected in the line 29 between points 30 and 32 respectively, as shown.

At point 30 an additional line 34 connects to a diode 36 and point 38 is connected to the base 39 of a second NPN transistor 40 which is the same as transistor 12. Connected to point 38 by means of line 41 is a suitable reset means 42. This reset component, forming no part of this invention, can be a computer reset signal or any logic signal. A diode 44 is connected between the reset button 42 and point 38. Point 38 and thus base 39 of transistor 40 is connected to ground by line 45 with a 0.001 mfd. capacitor 46 in series as shown. The emitter 48 of transistor 40 is also connected to the ground with a 1-k. ohm resistor 59 in series therebetween. The collector 52 of transistor 40 is connected to the 5-volt power supply 22 by means of lines 51 and 53. Line 51 is connected to line 53 at point 54 and line 53 to line 29 at point 32. A resistor 55 of 2 k. ohms is provided in line 5 between points 54 and 56. Emitter 48 at point 57 is connected to the base 58 of an NPN transistor 60. Emitter 48 and point 57 are both connected to the base 58 of transistor 60 and together they are both connected, at point 57, to ground line 63 through a 1-k. ohm resistor 59. The emitter 62 of transistor 60 is connected direct to ground by means of line 63.

At point 56 the base 64 of transistor 70 is connected to the collector 52 of transistor 40. The collector 66 of transistor 60 is connected to the emitter 68 of transistor 70 by means of line 67, which, in turn, at point 69 are both connected to output 74 by means of line 75. The collector 76 is connected to the 5-volt power supply 22 by means of line 53 with a 100-ohm resistor 78 in series, as shown. The output 74 is connected to diode 80 by means of feedback line 81 which provides a hold circuit which holds the switch on even after the finger has been removed from key 10, as will be explained in more detail later.

Figure 2:
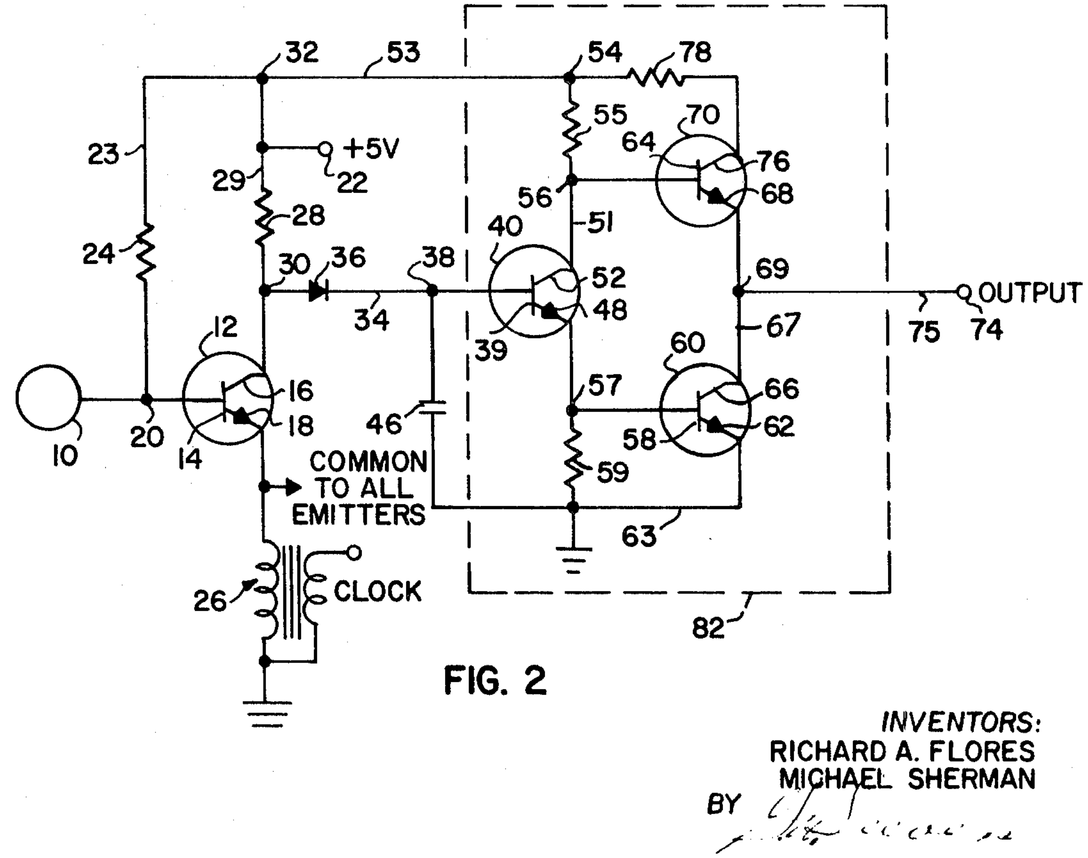
FIG. 2 shows a modification illustrating how the circuit can be simplified by elimination of the feedback and hold circuit.

Turning now to a detailed description of the modification shown in FIG. 2, it is believed that if it is initially appreciated that this circuit differs from the circuit in FIG. 1 only in that the switch is automatically reset the instant the finger or other ground is removed from the key 10. Therefore, basically the hold line 81, the diode 80, the reset means 42 as well as diode 44, are eliminated, the remainder of the circuitry is identical to that of FIG. 1 and the operation of these two Figures is otherwise identical.

Figure 3:
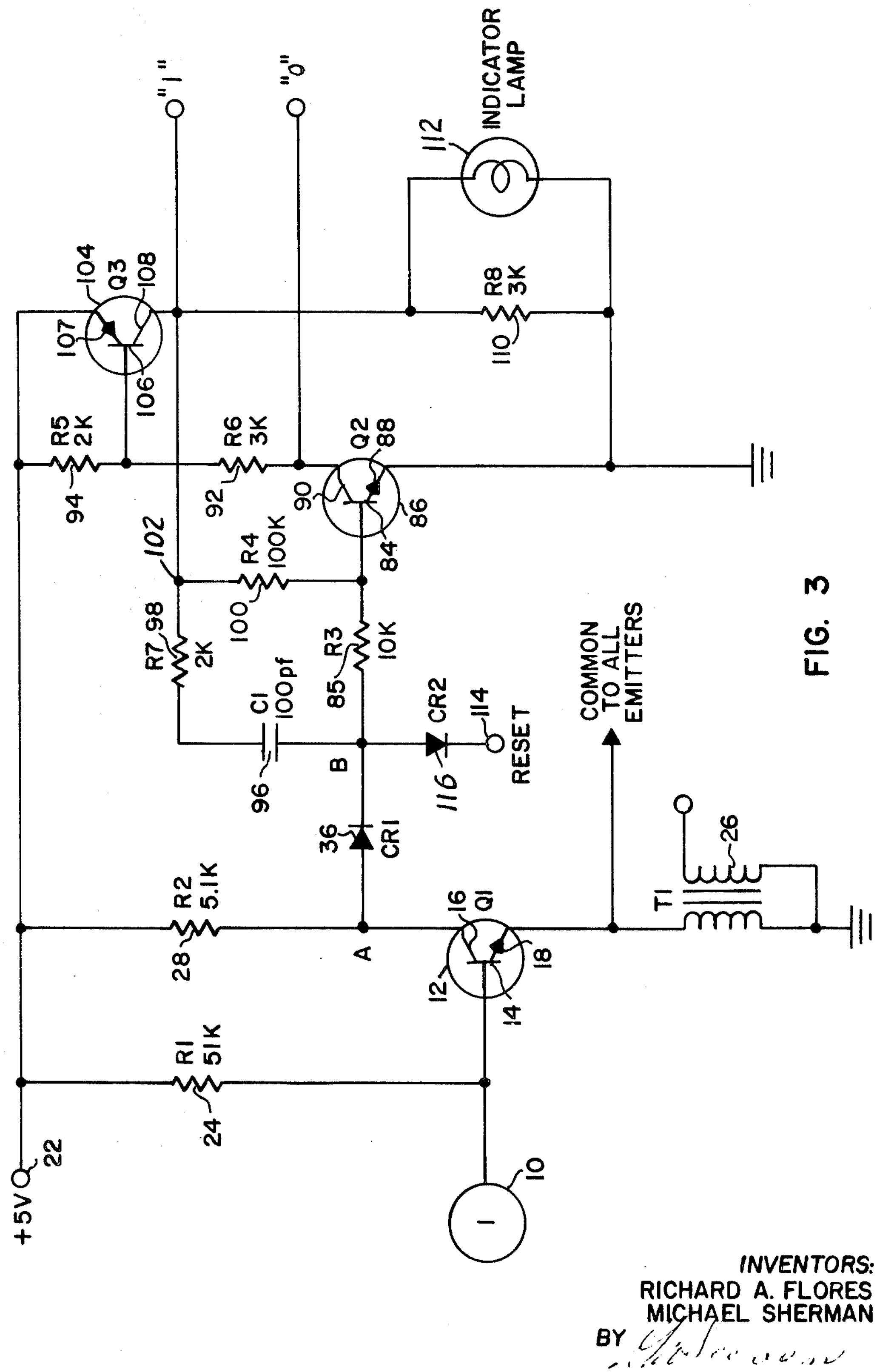
FIG. 3 shows a further modification illustrating how the "-pulse amplifier circuit" can be modified to simplify this circuit and to improve the operation of the circuit.

Turning again to another modification, there follows a description of the form of this invention illustrated in FIG. 3. Like the circuit of FIG. 2, it should be appreciated that this circuit differs from the circuits of FIGS. 1 and 2 in the "output" section. That is to say, that here the numeral 10 refers to the touch key, the numeral 12 refers to NPN transistor having a base 14, a collector 16 and an emitter 18. A plus or positive 5-volt power supply 22, identical to FIGS. 1 and 2, is connected to the base 14 of transistor 12 with a 51-k. ohm resistor 24 in series therewith. A 5.1-k. ohm resistor 28 serially connects the plus 5-volt power supply also to the collector 16 of transistor 12. A clock or timer 26 furnishes negative 1-volt pulses to the emitter 18 of transistor 12, all in the same manner as FIGS. 1 and 2. As in FIG. 1, the plus 5-volt power supply and also the collector 16 are connected to the base 84 of a second NPN transistor 86 through a diode 36 with a 10-k. ohm resistor 85. The emitter 88 of transistor 86 is connected direct to ground. The collector 90 of transistor 86 is connected to the plus 5-volt power supply with two resistors 92 and 94 of 3-k. ohms resistance and 2-k. ohms resistance in series therewith. A 100 pf. condenser 96, a 2-k. resistor 98 and 100-k. resistor 100 in series shunt around capacitor 96. Point 102 disposed intermediate resistors 98 and 100 connect the output circuit to the binary "1" output as shown in FIG. 3. The collector 90 of transistor 86 is connected direct to the binary "0" output as shown.

A PNP transistor 104 has its base 106 connected through a 3-k. ohms resistor 92 to the binary "0" output and to the collector 90 of transistor 86. It is also connected through resistor 94 to the plus 5-volt power supply 22. The emitter 107 of PNP transistor 104 is connected direct to the plus 5-volt power supply. A 3-k. ohm resistor 110 connects the binary "1" output to ground. Suitably, if desired, an indicator lamp 112, as shown, may be provided across the 3-k. resistor 110.

OPERATION

Basically, clock 26 pulses actively operate or trigger the switch circuit to energize the circuit in a pulse amplifier mode with transistor 12 conducting. Normally, current is supplied to the base 14 through resistor 24 from the 5-volt power supply 22. This keeps the collector 16 approximately at ground potential because the collector 16 and the base 14 are following the emitter 18. There being approximately +0.6 volt on the base during the nonpulse phase of the circuit and approximately −0.4 volts on the base 14 during the negative 1-volt phase produced by the clock source 26. The explanation of this situation is that due to the floating base 14 of the NPN transistor 12, the base is free to and follows the emitter 18. The resultant effect on the collector is a varied degree of saturation. More specifically, when a pulse from clock source 26, at emitter 18, goes from 0 to 1 volt, the base 14 will change by −1 volt in the same minus direction, in other words, there normally being only +0.6 volt on the base 14, there will be a −0.4 on the base. As long as the collector voltage is below +1.5 volts, transistors 40, 60 and 70 making up the output stage of the pulse amplifier 82 and control for the feedback path 81 remain in a steady state. That is to say, they are not triggered.

When the input key 10 is touched, a ground reference is placed on the base 14 of the transistor 10 and it is no longer free to follow the emitter 18. During the negative 1-volt phase of the clock, the base 14 is within its normal tolerance of "0" and will continue to conduct. The collector voltage will approximately be as near ground level as it was before the contact was made. However, for the duration of the cycle between negative 1-volt pulse, when the emitter 18 is at ground potential, and equal to the base 14 reference, the transistor 12 cuts off. The collector 16 voltage goes positive to charge the capacitor 46 to a positive potential. At this signal the positive going base 39 of transistor 40 turns on transistor 40.

When the next negative clock pulse appears on the emitter 18 of transistor 12, the collector 16 goes again negative. However, the base 39 of transistor 40 does not go negative due to the diode 36 which now becomes back biased. Capacitor 46 will slowly begin to discharge due to the large discharging time constant. By virtue of the above proper selective choice of capacitor to form the desired charging and discharging time constants, the transistor 40 is kept on continuously while the key 10 is contacted by the finger. The result of every clock pulse going through transistor 12 when it is in a switching mode, and then through diode 36 is to keep capacitor 46 constantly recharged or resupplied. This makes the switch circuit insensitive to spurious noises because the clock pulses are injected continuously to actively operate the circuit in a pulse amplifier mode. The result of this pulse amplifier mode is to keep the circuit noise free and maintain the capacitor 96 at full charge which is sufficient to supply adequate power to control the circuit or to maintain the necessary potential on the base 39 of transistor 40. It will be seen from this that it is very important that charging and discharging time constants with respect to the clock pulse rate be properly chosen and when they are, the transistor 40 will be kept continuously on when the key 10 is in finger contact.

While transistor 40 is turned on its emitter 48 provides a positive current to the base 58 of transistor 60, which, in turn, is therefore kept turned on. With transistor 60 turned on the output voltage goes to ground potential through line 63. Now with the output 74 of FIG. 1, being connected to the input or base 14 of transistor 12 and with diode 80 connected in the line 81, the circuit becomes bistable. That is, as soon as the output level goes to ground as a result of touching the key 10, there is provided a permanent ground reference to the base 14 of transistor 12 through the feedback line 81. Under these conditions the finger "1" may be removed from the key 10 but the output continues to remain at ground potential. It will be seen from this that the circuit, until it is reset, latches into a binary "0" state with the first clock pulse immediately following the grounding of key 10. This state continues to exist even though the finger is removed from key 10.

To reset the circuit to a binary "1" state, it is necessary that transistor 60 be turned off so that the output from emitter 68 of transistor 70 will conduct to the output 74. This is done simply by applying any suitable negative (it may be grounding by a finger) pulse to reset point 42 and at the diode 44. As will be seen from considering the diagram of FIG. 1, the negative pulsing of diode 44 thus stops current from flowing to base 39 of transistor 40 thereby turning it off and at the same time closing current going to base 58 of transistor 60 which in turn prevents emitter 62 of transistor 60 from grounding the current coming from the emitter 68 of transistor 70.

Turning now to an explanation of the operation of the modification of FIG. 2, this modification simply stated eliminates the reset key 42 and feedback line 81 with the diode 80. By means of this change the switch and circuit changed from an automatic hold to a "finger hold only" circuit. If the feedback 81, shown only in FIG. 1, is not provided, the output circuit will maintain the logic "0" only for the duration of the ground contact made with the key 10. As soon as this contact is broken, the output 74 returns to the "1" state. In other words, without the feedback line 81 and diode 80, the base 14 of transistor 12 returns, on the next pulse of the clock source 26, to its stable state, i.e., grounding the +5 volts of power 22 through the secondary of the clock source 26 and keeps transistor 40 from turning on which, in turn, keeps transistor 60 turned off and this, in turn, allows the current from emitter 68 of transistor 70 to conduct into output 74 through transistor 70, resistance 78 and +5-volt power supply 22.

Turning now to an explanation of the operation of the modification of FIG. 3. This switch can be used as a component of a solid-state keyboard or as logic information computer inputs. It is to be noted that the output levels of the solid-state switch embodying this invention are directly compatible with computer-integrated circuit logic.

In its normal operating mode, transistor 12 is operating. Base current is supplied to the base 14 of transistor 12 through the 51-k. resistor 24 to keep the collector 16 current flowing and to keep the collector voltage at approximately ground potential. This would be the same as the potential of the emitter. As long as the collector 16 of transistor 12 is below +1.5 v. (prior to key contact) no base current will be available to NPN transistor 86. With transistor 86 not conducting, no base current is available to transistor 104 and it is not conducting.

When the input key 10 is touched, a ground reference is placed on the base 14 of transistor 12 and this base is no longer free to follow the emitter 18. For the duration of the negative pulse, the transistor 12 will continue to conduct, but after the negative pulse dies out, transistor 12 will no longer conduct until the switch is reset or the finger ground is removed from the key 10. At this point collector 16 current and voltage will be near ground level as before the contact by the finger was made with the key 10. Also the collector 16 voltage goes positive for the duration between the negative clock pulses. As the collector voltage of transistor 12 goes positive, current flows from the +5-volt supply through resistor 28, diode 36 and resistor 85 into the base 84 of transistor 86. This voltage turns on transistor 86. The collector 90 voltage drops to ground level and current flowing in the collector 90 causes a voltage drop in the base 106 of transistor 104 to a level where PNP transistor 104 starts to conduct. The collector 108 goes positive and couples a positive pulse through the capacitor 96 to reinforce the turning on of transistor 86. When the next negative pulse from the clock 26 occurs at the emitter 18 of transistor 12 and contact is still maintained with the key 10, the collector 16 of transistor 12 again goes negative.

As long as contact with key 10 is maintained, the collector 16 will turn on and off at the rate of the clock pulses. For every positive going level at the collector 16, the charge on the capacitor 96 will be reinforced. For every negative going pulse level, the diode 36 will be back-biased and will not allow the voltage level at the capacitor 96 junction to follow. As a result of this action, transistors 86 and 104 will remain on as long as contact is maintained with the key 10. In this configuration a small capacitor value is sufficient to give a large time constant due to the effective resistance of resistance 98 being multiplied by the gain of transistors 86 and 104.

When contact with key 10 is interrupted, the collector 16 of transistor 12 drops to its original low voltage level and remains there. No more positive pulses are available to keep the capacitor 96 charged. The only current to keep transistor 86 on is very small due to the large value of resistor 100. Therefore, very shortly after key contact is broken, no energy will be available to maintain transistors 86 and 104 in conduction. As a result, transistor 86 will turn off. This will cause the collector 90 of transistor 86 to go positive removing the base current from transistor 104 and it cuts off. The negative going collector of transistor 104, due to cut off, couples a negative pulse to the base of transistor 86 through capacitor 96 to cut off transistor 86 faster. This results in a monostable action or the output will switch as contact is made with the key 10 and will continue only for the duration of the contact.

If it is desirable to have a bistable switching, the resistor 100 can be made 10 times smaller (from 100k. to 10k.). This will turn on transistors 86 and 104 as contact is made with the key 10 and will remain on after key contact is broken. A negative pulse applied to reset diode 116 at key 114 will reset the circuit to its standby state.

What we claim is:

1. A touch-responsive switch circuit for the control of a logic output comprising the combination of:

A. a power terminal adapted to be connected to a power supply;

B. a normally conducting transistor (having a collector, base and emitter), the collector of said transistor being connected to said power terminal through a resistor and the base of said transistor being also coupled to said power terminal through a resistor;

C. a clock-pulse generator connecting the emitter of said transistor to a ground;

D. a transistorized output control circuit connected to a binary output and to and controlled by the collector of said first mentioned transistor; and E. a ground reference key adapted to be touched by a finger, said key being connected direct to the base of said first mentioned transistor, said first mentioned transistor being normally conducting from said power source to said ground and being switched to a nonconductive state upon the grounding of said base by touching said key whereby said output control circuit is switched from a nonconducting to a conducting state.

2. A touch-responsive circuit for the control of a logic output according to claim 1, in which a feedback circuit extends from said output control to the base of said first mentioned transistor, whereby once the output signal is fed back to the base of said transistor thereby holding said base at ground potential.

3. A touch-responsive switch for the control of a logic output according to claim 2, in which there is a reset key connected to the base of said first mentioned transistor, and also to said transistorized output control circuit.

4. A touch-responsive switch circuit for the control of a logic output according to claim 1, in which the clock pulses are normally grounded by said first transistor when said transistor is conducting and said transistor is turned off, and said transistor is nonconducting to ground when the base is grounded by touching said ground reference key.

5. A touch-responsive switch circuit for the control of a logic output according to claim 4, in which the output circuit is a pulse-amplifying circuit comprising the combination of a first, second and third NPN transistor;

A. the base of said first transistor being coupled to the collector of said first mentioned transistor and normally being maintained in a nonconducting state;

B. the second of said pulse-amplifying transistor having its base coupled to the emitter of said first pulse amplifying transistor and normally being nonconductive;

C. the third of said pulse-amplifying transistors having its base coupled to the collector of said first pulse-amplifying transistor and normally being conductive; and D. the emitter of said third transistor being coupled to the collector of said second transistor and also connected direct to the logic output of said switch.

6. A touch-responsive switch circuit for the control of a logic output according to claim 5, in which there is provided a feedback circuit from the output to the base of said first-mentioned transistor adapted to hold the output of said switch in a positive conducting position after the finger grounding the reference key has been removed.

7. A touch-responsive switch circuit for the control of a logic output comprising the combination of:

A. a power terminal adapted to be connected to a power supply;

B. a normally conducting NPN transistor (having a collector, base and emitter), the collector of said transistor being connected to said power terminal through a resistor and the base of said transistor being also coupled to the power terminal through a second resistor;

C. a clock-pulse generator connected between the emitter of said transistor and a ground;

D. a second NPN transistor being normally nonconductive;

E. the base of said second transistor being coupled to the collector of said first NPN transistor and also coupled to said power terminal through a back-biased diode, the emitter of said transistor being coupled direct to ground and the collector to said power terminal;

F. a third transistor, said transistor being a PNP transistor having its base coupled to said power terminal and to the collector of said second transistor, the emitter of said transistor being coupled direct to said power terminal and the collector of said transistor being coupled direct to a 1 logic output and also to the base of said second transistor through a resistor;

G. the collector of said second transistor being coupled to an 0 logic output and also to the base of said third transistor;

H. a ground reference key adapted to be touched by a finger, said key being connected direct to the base of said first transistor, said first transistor being normally conducting from said power source to said ground and being switched to a nonconductive state upon the grounding of the base by touching said key, whereby said second transistor is switched from a nonconductive to a conductive state; and I. a capacitor coupled across the base of said second transistor and the collector of said third transistor adapted to keep said second transistor conducting after the finger has been removed from said ground reference key.

8. A touch-responsive switch for the control of a logic output circuit according to claim 7, in which there is a reset key connected to said capacitor and the base of said second transistor.